(12) United States Patent
Wang et al.

(10) Patent No.: US 8,507,159 B2
(45) Date of Patent: Aug. 13, 2013

(54) ELECTRON BEAM DATA STORAGE SYSTEM AND METHOD FOR HIGH VOLUME MANUFACTURING

(75) Inventors: Hung-Chun Wang, Taichung County (TW); Pei-Shiang Chen, Hsinchu (TW); Tzu-Chin Lin, Hsinchu (TW); Faruk Krecinic, Hsin Chu (TW); Jeng-Horng Chen, Hsin-Chu (TW); Wen-Chun Huang, Tainan County (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 13/049,123

(22) Filed: Mar. 16, 2011

(65) Prior Publication Data

US 2012/0237877 A1    Sep. 20, 2012

(51) Int. Cl.
*G03F 9/00* (2006.01)

(52) U.S. Cl.
USPC .............................. 430/30; 430/296; 430/942

(58) Field of Classification Search
USPC ........................................... 430/30, 296, 942
See application file for complete search history.

(56) References Cited

U.S. PATENT DOCUMENTS

| 4,531,191 | A | 7/1985 | Koyama |
| 6,361,911 | B1 | 3/2002 | Tsai et al. |
| 7,590,966 | B2 * | 9/2009 | Sandstrom et al. ............. 716/50 |
| 7,842,935 | B2 | 11/2010 | Aloni et al. |
| 2006/0055903 | A1 | 3/2006 | Thuren et al. |
| 2008/0001097 | A1 | 1/2008 | Nakasugi et al. |

* cited by examiner

*Primary Examiner* — Christopher Young
(74) *Attorney, Agent, or Firm* — Haynes and Boone, LLP

(57) ABSTRACT

The present disclosure provides for many different embodiments of a charged particle beam data storage system and method. In an example, a method includes dividing a design layout into a plurality of units; creating a lookup table that maps each of the plurality of units to its position within the design layout and a data set, wherein the lookup table associates any repeating units in the plurality of units to a same data set; and exposing an energy sensitive layer to a charged particle beam based on the lookup table.

16 Claims, 7 Drawing Sheets

ELECTRON BEAM DATA STORAGE SYSTEM AND METHOD FOR HIGH VOLUME MANUFACTURING

BACKGROUND

Microfabrication conventionally uses photolithography or optical lithography processes for selectively removing parts of a substrate, or parts of a material layer on the substrate. For example, photolithography uses a directed light (radiation) source to transfer a pattern from a photomask (also referred to as a mask or reticle) to a light-sensitive resist material formed on the substrate or material layer, thereby generating an exposure pattern in the resist material. Chemical treatments may then be used to etch or otherwise transfer the exposure pattern in the resist material to the substrate or material layer. More recently, microfabrication has implemented other lithography types, such as charged particle beam lithography, that do not necessitate the intermediary step of creating the mask to transfer or generate an exposure pattern in a resist material. For example, electron beam (e-beam) lithography uses a focused beam of electrons to expose the resist material. Instead of using a mask, e-beam lithography "writes" a pattern directly into an energy-sensitive resist material using electron beams. An e-beam exposure tool generally writes the pattern from an electronic or computer-type file, which is used to control an exposure source of the e-beam exposure tool. The exposure source may be selectively directed onto the substrate, material layer, or resist material to be patterned. More particularly, the e-beam exposure tool is generally configured such that exposing a circuit pattern is not accomplished by illuminating the resist material through a mask or film negative of the circuit, but rather by directly and selectively exposing desired areas of the resist material or material layer on the substrate with a focused beam of an appropriate energy and dosage for creating the desired circuit pattern. Sometimes, e-beam lithography implements multiple e-beams to write a circuit pattern. The data associated with implementing such writing is larger than desirable, requiring longer data transfer time, longer data processing time, and additional processing costs. Accordingly, although existing e-beam lithography systems and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method that reduces data size of a design layout according to various aspects of the present disclosure.

FIGS. 2A and 2B illustrate a portion of a design layout that is divided into more than one unit according to the method of FIG. 1.

FIG. 3 illustrates creating a lookup table for a portion of a design layout according to the method of FIG. 1.

FIG. 4 illustrates creating a lookup table for another portion of a design layout according to the method of FIG. 1.

FIG. 5 is a flow chart of another method that reduces data size of a design layout according to various aspects of the present disclosure.

FIG. 6 is a simplified block diagram of a lithography apparatus that can implement the methods of FIGS. 1 and 5 according to various aspects of the present disclosure.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 10 that reduces data size of a design layout to be written on a recording medium according to various aspects of the present disclosure. In the depicted embodiment, the method 10 is a lithography method, specifically a charged particle beam lithography method, such as an electron beam lithography method. FIG. 1 has been simplified for the sake of clarity to better understand the inventive concepts of the present disclosure. Additional steps can be provided before, during, and after the method 10, and some of the steps described can be replaced or eliminated for other embodiments of the method.

At block 20, a design layout is divided into a plurality of units. The design layout (also referred to as a pattern layout) may be presented in one or more data files having information of a pattern to be fabricated. In the depicted embodiment, the design layout has a data representation of a first data size. The design layout can be expressed in a GDSII file format, an OASIS file format, a DFII file format, or other suitable file format. In furtherance of the depicted embodiment, the design layout is an integrated circuit (IC) design layout. The IC design layout includes at least one feature based on a specification of an IC device (product) to be manufactured. The features have various geometrical patterns designed for the IC device. The various geometrical patterns typically correspond to patterns of various conductor, insulator, and/or semiconductor layers that combine to form various IC features/components of the IC device, such as an active region, a gate electrode, a source and drain, a multilayer interconnection (MLI), a bonding pad opening, other suitable features/components, or combinations thereof. The design layout's data representation of the first data size includes data sets associated with the various patterns. A pattern may be repeated within the design layout, and the design layout's data representation of the first data size will include a data set for each pattern, even if the pattern is repeated in the design layout. For example, if the pattern occurs ten times within the design layout, the data representation of the first size will include ten of the data set associated with the repeating pattern. In the depicted embodiment, the method 100 divides the design layout into more than one unit. For example, the IC design layout may be divided into units by die, cell, function, device, pattern, or other suitable feature. Each unit includes a portion of the design layout, more particularly, a pattern portion of the design layout, which has a data set associated therewith. The data set may be a pattern writing instruction set to be used by a charged particle beam apparatus when writing the design layout. By including repeating units, or repeating patterns, once in the data representation, the data representation's size is reduced. For example, if the pattern portion occurs ten times within the design layout, the data representation will include one of the data set associated with the repeating pattern portion, instead of ten. The data representation thus has a second size, which is smaller than the first size.

Figure 2A:
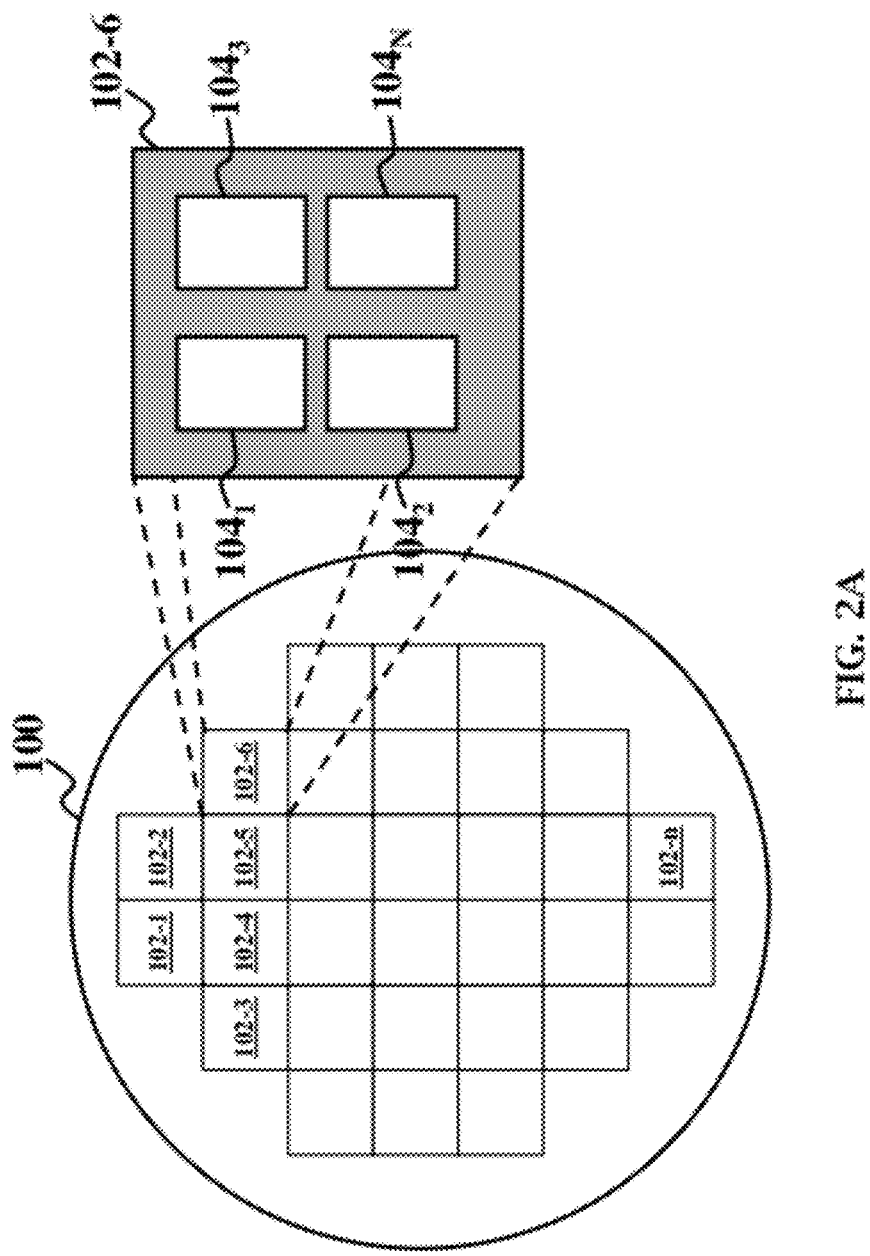
Figure 2B:
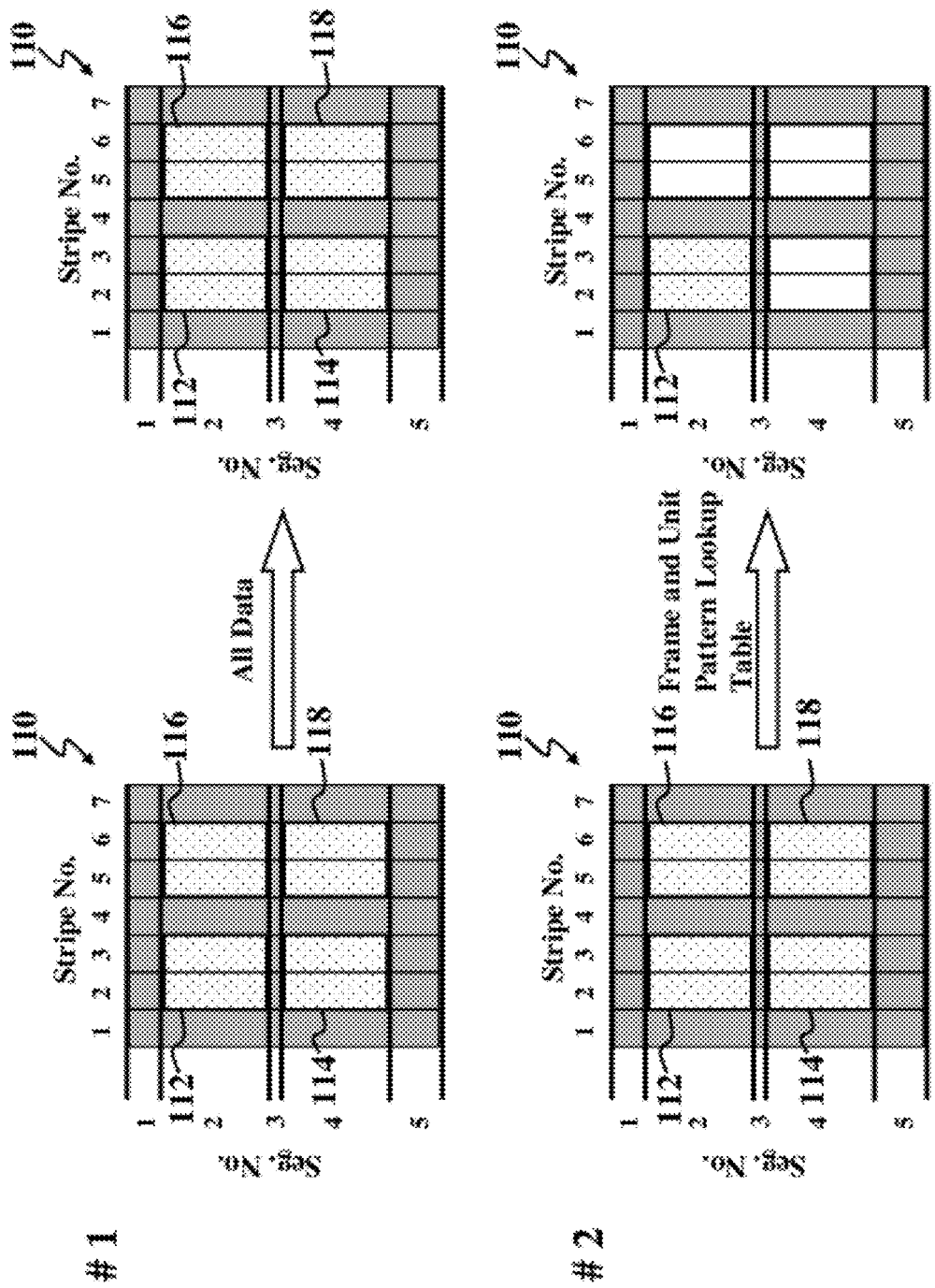

FIGS. 2A and 2B illustrate a portion of a design layout that is divided into more than one unit according to various aspects of the present disclosure. In FIG. 2A, a design layout 100 is divided into frames 102-1, 102-2, 102-3, 102-4, 102-5, 102-6, ..., 102-n. Each frame 102-1, 102-2, 102-3, 102-4, 102-5, 102-6, ..., 102-n includes a pattern portion of the design layout. For example, in the depicted embodiment, frame 102-6 includes unit patterns $104_1, 104_2, 104_3, \ldots 104_N$. The frame 102-6 includes four unit patterns. Each frame 102-1, 102-2, 102-3, 102-4, 102-5, 102-6, ..., 102-n may include more or less unit patterns than the unit patterns associated with frame 102-6, illustrated in FIG. 2A. Each unit pattern has a data set associated therewith. In an example, each unit pattern has a pattern writing instruction set associated therewith, such that a charged particle beam apparatus can use the pattern writing instruction set to write the associated unit pattern on a wafer and/or energy sensitive layer.

Each frame is then divided into stripes and segments. FIG. 2B illustrates a portion 110 of the design layout 100, specifically a frame such as frame 102-6, divided into stripes and segments. The portion 110 of the design layout 100 includes four unit patterns 112, 114, 116, and 118. In the depicted embodiment, unit patterns 112, 114, 116, and 118 have a same pattern. A data set, such as a pattern writing instruction set, is associated with each unit pattern. The frame is divided into seven stripes and five segments. The number of stripes may be equivalent to a number of charged particle beams that can write a pattern in a frame. Here, since the frame is divided into seven stripes, seven charged particle beams can write a pattern in a frame. The number of segments may be determined by the design layout 100. For example, each stripe of the design layout 100 may include a plurality of units with at least one unique unit, and the number of segments may be the number of units in its respective stripe. The pattern writing instruction set may define a location or position of the unit pattern within the design layout 100 and/or the frame based on the stripe-segments. For example, unit pattern 112 is located at stripe 2, segment 2 and stripe 3, segment 2 within the frame; unit pattern 114 is located at stripe 2, segment 4 and stripe 3, segment 4 within the frame; unit pattern 116 is located at stripe 5, segment 2 and stripe 6, segment 2 within the frame; and unit pattern 118 is located at stripe 5, segment 4 and stripe 6, segment 4.

A conventional process is illustrated by Scenario #1 in FIG. 2B, and the process at block 20 is illustrated in Scenario #2 in FIG. 2B. The conventional process transfers data sets associated with every unit pattern within the design layout. For example, even though unit patterns 112, 114, 116, and 118 are exactly the same, other than each unit pattern's location within the design layout 110 and frame, data sets associated with unit patterns 112, 114, 116, and 118 are processed for exposure purposes and/or transferred from a charged particle beam data processing module to a charged particle beam exposure module. Put another way, the design layout's data representation remains at the first size for subsequent processing, because every data set associated with a unit pattern is subsequently processed, despite the fact that the design layout may include repetitive data sets. This can require substantial data storage size, data transfer time, data transfer bandwidth, data transfer size, and other data processing requirements. To alleviate such data size, time, transfer size/bandwidth, and/or other processing requirements, in Scenario #2, at block 20, the design layout's data representation is reduced by including one data set for any repeating pattern units, and thus, subjecting one data set for any repeating pattern units to processing. In FIG. 2B, since unit patterns 112, 114, 116, and 118 are exactly the same, other than location/position within the design layout 100 and frame, one data set representative of each unit pattern 112, 114, 116, and 118 is processed and transferred. In the depicted embodiment, the data set associated with unit pattern 112 is processed and transferred.

At block 30, a lookup table is created that maps each unit to its position within the design layout and a data set, wherein the lookup table associates any repeating units to a same data set. More specifically, for each unit, the lookup table indicates a position of the unit within the design layout and the data set associated with the unit. As noted above, since the data representation of the second size includes repeating pattern portions once, the lookup table will indicate the same data set for any repeating portions. For example, referring to FIGS. 2A and 2B, the lookup table will map the data set associated with unit pattern 112 to the stripe-segments occupied by unit patterns 112, 114, 116, and 118.

Figure 3:
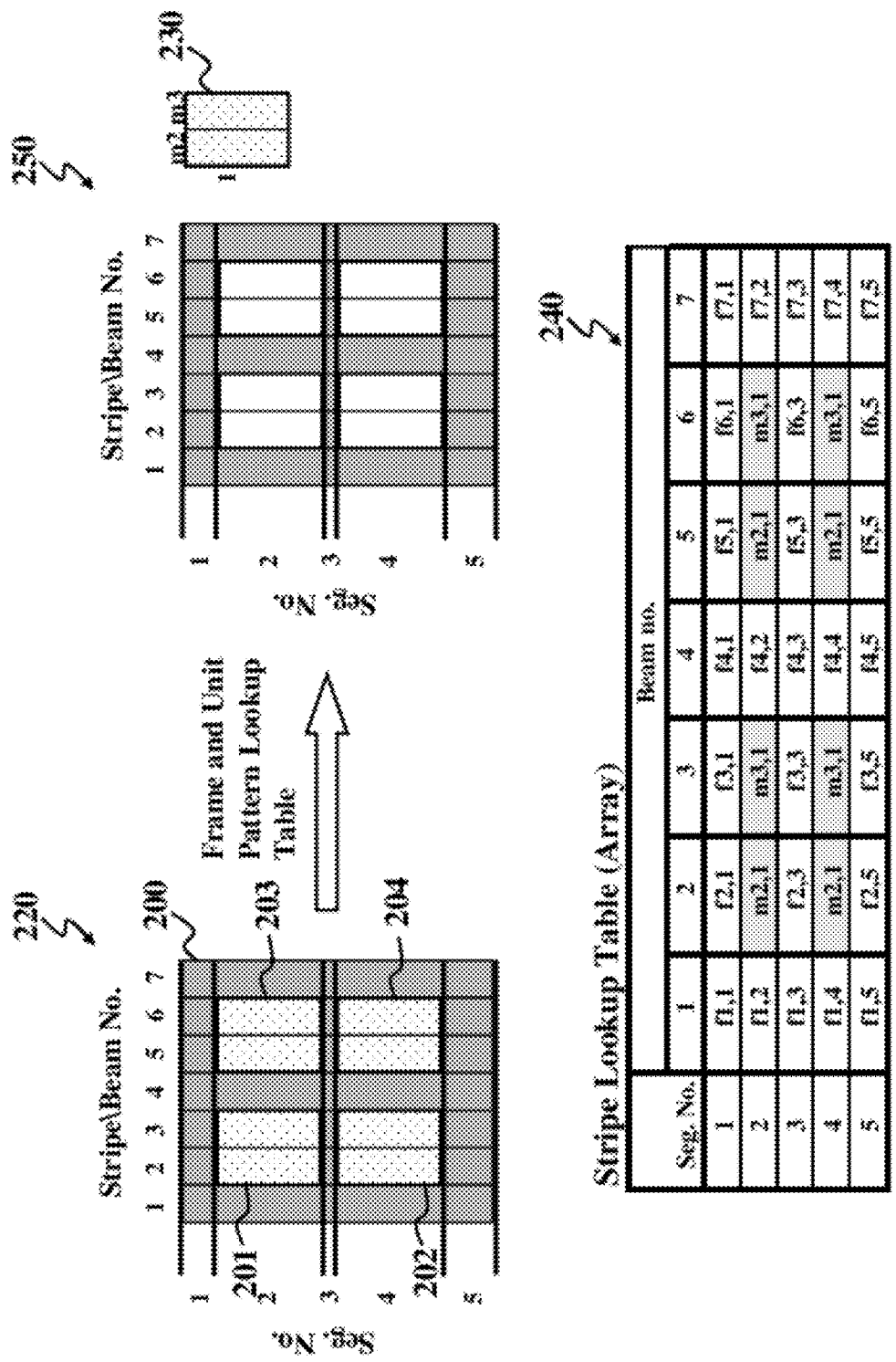

FIG. 3 illustrates creating a lookup table for a portion 220 of a design layout, such as design layout 100, according to various aspects of the present disclosure. In FIG. 3, the portion 220 of a design layout includes a frame 200. The frame 200 includes unit patterns 201, 202, 203, and 204. The frame 200 may have more or less unit patterns than that illustrated. In the depicted embodiment, each of the unit patterns 201, 202, 203, and 204 has a same pattern. The frame 200 is divided into stripe-segment units. For example, the frame 200 is divided into seven stripes and five segments. The frame 200 may be divided into more or less stripes and segments. A data set, such as a pattern writing instruction, is associated with each stripe-segment of frame 200. Where the stripe-segment is not occupied by a portion of a unit pattern, the pattern writing instruction may not include pattern writing data. Where the stripe segment is occupied by a portion of a unit pattern, the pattern writing instruction includes pattern writing data associated with the occupying unit pattern portion. The data representation of the portion 220 of the design layout thus includes data sets for each stripe-segment of the frame 200. In the depicted embodiment, since data sets associated with unit patterns 201, 202, 203, and 204 are the same, the data sets associated with stripe-segments 2,2, 5,2, 2,4, and 5,4 are the same, and the data sets associated with stripe-segments 3,2, 6,2, 3,4, and 6,4 are the same. Accordingly, an alias unit pattern 230 is defined that represents the repetitive unit patterns 201, 202, 203, and 204. The alias unit pattern 230 is associated with alias stripe-segments m2,1 and m3,1. Alias unit pattern 230 has a data set associated therewith that is identical to the data sets associated with unit patterns 201, 202, 203, and 204.

A lookup table 240 is then created to map the alias unit pattern 230 to its appropriate positions with the design layout. For frame (f) 200, the lookup table maps data sets with their respective stripe-segments within the frame 200. For example, the lookup table 240 associates each portion of the pattern in frame 200 with its appropriate stripe number and segment number. In the depicted embodiment, the lookup table 240 associates a stripe-segment data set f1,1 to stripe number 1, segment number 1. The lookup table 240 associates stripe-segment data set m2,1 and m3,1 with the repetitive unit patterns in the frame, particularly at stripe-segments 2,2, 3,2, 5,2, 6,2, 2,4, 3,4, 5,4, and 6,4. Accordingly, the lookup table 240 maps stripe-segment data sets stored in a memory to appropriate positions within the frame 200. The lookup table 240 thus allows a reduced portion 250 of the design layout 250 that has a smaller data size than the portion 220 of the design layout.

Figure 4:
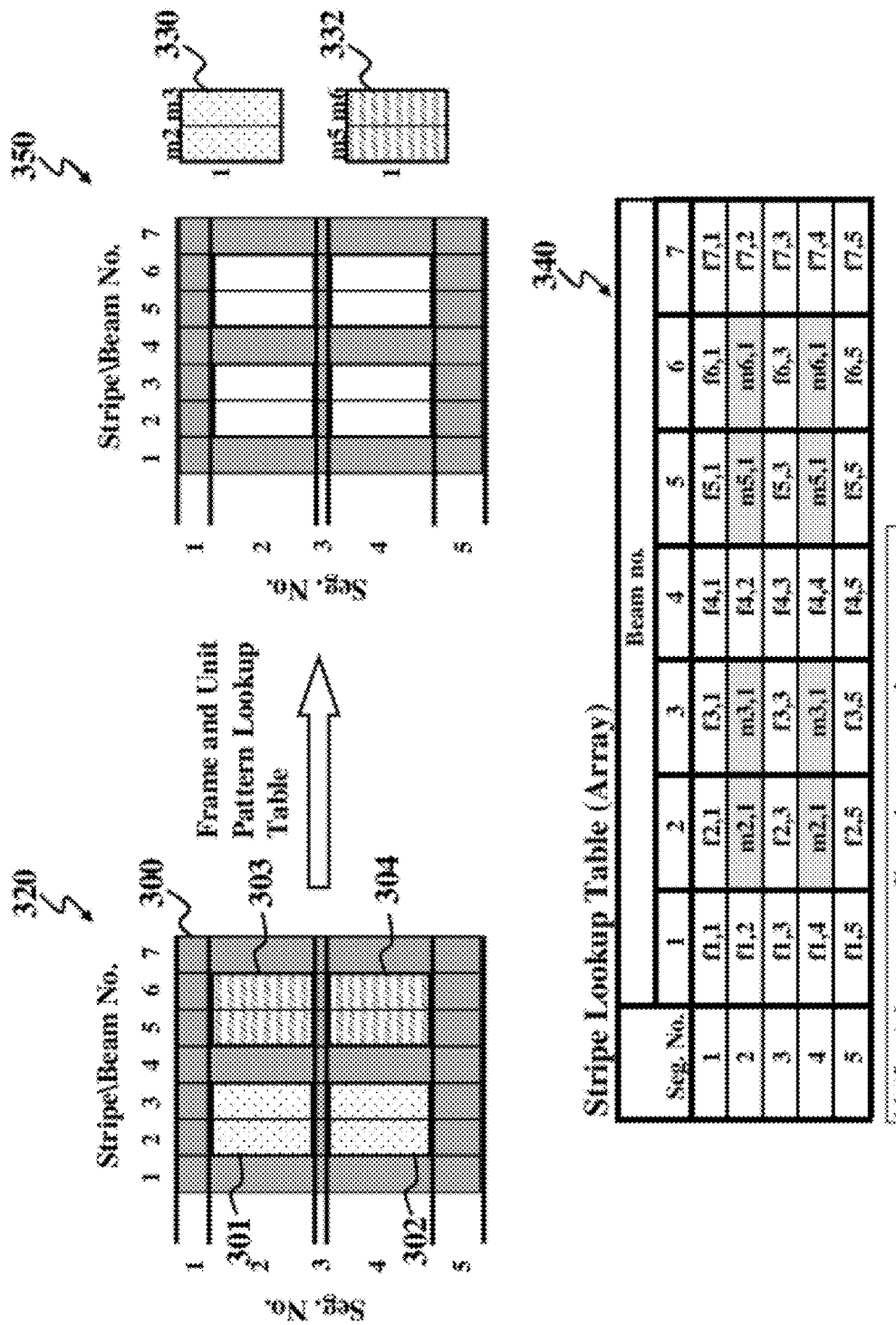

FIG. 4 illustrates creating a lookup table for another portion 320 of a design layout, such as design layout 100, according to various aspects of the present disclosure. In FIG. 4, the portion 320 of a design layout includes a frame 300. The frame 300 includes unit patterns 301, 302, 303, and 304. The frame 300 may have more or less unit patterns than that illustrated. In the depicted embodiment, unit patterns 301 and 302 have a same pattern, and unit patterns 303 and 304 have a same pattern that is different than unit patterns 301 and 302. The frame 300 is divided into stripe-segment units. For example, the frame 300 is divided into seven stripes and five segments. The frame 300 may be divided into more or less stripes and segments. A data set, such as a pattern writing instruction, is associated with each stripe-segment of frame 300. Where the stripe-segment is not occupied by a portion of a unit pattern, the pattern writing instruction may not include pattern writing data. Where the stripe segment is occupied by a portion of a unit pattern, the pattern writing instruction includes pattern writing data associated with the occupying unit pattern portion. The data representation of the portion 320 of the design layout thus includes data sets for each stripe-segment of the frame 300. In the depicted embodiment, since data sets associated with unit patterns 301 and 302 are the same, the data sets associated with stripe-segments 2,2 and 2,4 are the same, and the data sets associated with stripe-segments 3,2 and 3,4 are the same. Accordingly, an alias unit pattern 330 is defined that represents the repetitive unit patterns 301 and 302. The alias unit pattern 330 is associated with alias stripe-segments m2,1 and m3,1. Alias unit pattern 330 has a data set associated therewith that is identical to the data sets associated with unit patterns 301 and 302. Similarly, since data sets associated with unit patterns 303 and 304 are the same, the data sets associated with stripe-segments 5,2 and 5,4 are the same, and the data sets associated with stripe-segments 6,2 and 6,4 are the same. Accordingly, an alias unit pattern 332 is defined that represents the repetitive unit patterns 303 and 304. The alias unit pattern 332 is associated with alias stripe-segments m5,1 and m6,1. Alias unit pattern 332 has a data set associated therewith that is identical to the data sets associated with unit patterns 303 and 304.

A lookup table 340 is then created to map the alias unit patterns 330 and 332 to their appropriate positions with the design layout. For frame (f) 300, the lookup table maps data sets with their respective stripe-segments within the frame 300. For example, the lookup table 340 associates each portion of the pattern in frame 300 with its appropriate stripe number and segment number. In the depicted embodiment, the lookup table 340 associates a stripe-segment data set f1,1 to stripe number 1, segment number 1. The lookup table 340 associates stripe-segment data set m2,1 and m3,1 with the repetitive unit patterns 301 and 302 in the frame, particularly at stripe-segments 2,2 3,2, 2,4, and 3,4. The lookup table 340 also associates stripe-segment data set m5,1 and m6,1 with the repetitive unit patterns 303 and 304 in the frame, particularly at stripe-segments 5,2 6,2, 5,4, and 6,4. Accordingly, the lookup table 340 maps stripe-segment data sets stored in a memory to appropriate positions within the frame 300. The lookup table 340 thus allows a reduced portion 350 of the design layout 350 that has a smaller data size than the portion 320 of the design layout.

At block 40, an energy sensitive layer is exposed to a charged particle beam based on the lookup table. In the depicted embodiment, the charged particle beam writes the design layout on the energy sensitive layer using the lookup table and the data representation of the second, smaller data size. For example, the lookup table indicates a location (position) of each pattern portion within the design layout along with a location of the data set associated with each pattern portion. The lookup table thus aids a charged particle beam apparatus in appropriately exposing the energy sensitive layer. The energy sensitive layer may be disposed over a wafer. The wafer is a semiconductor substrate, a mask blank, a glass substrate, a flat panel substrate, or other suitable substrate. In the depicted embodiment, the charged particle beam is an electron beam. The electron beam may include multiple electron beams. Alternatively, the exposure process may utilize other radiation beams, such as ion beam, x-ray, deep ultraviolet, and other proper radiation energy.

Figure 5:
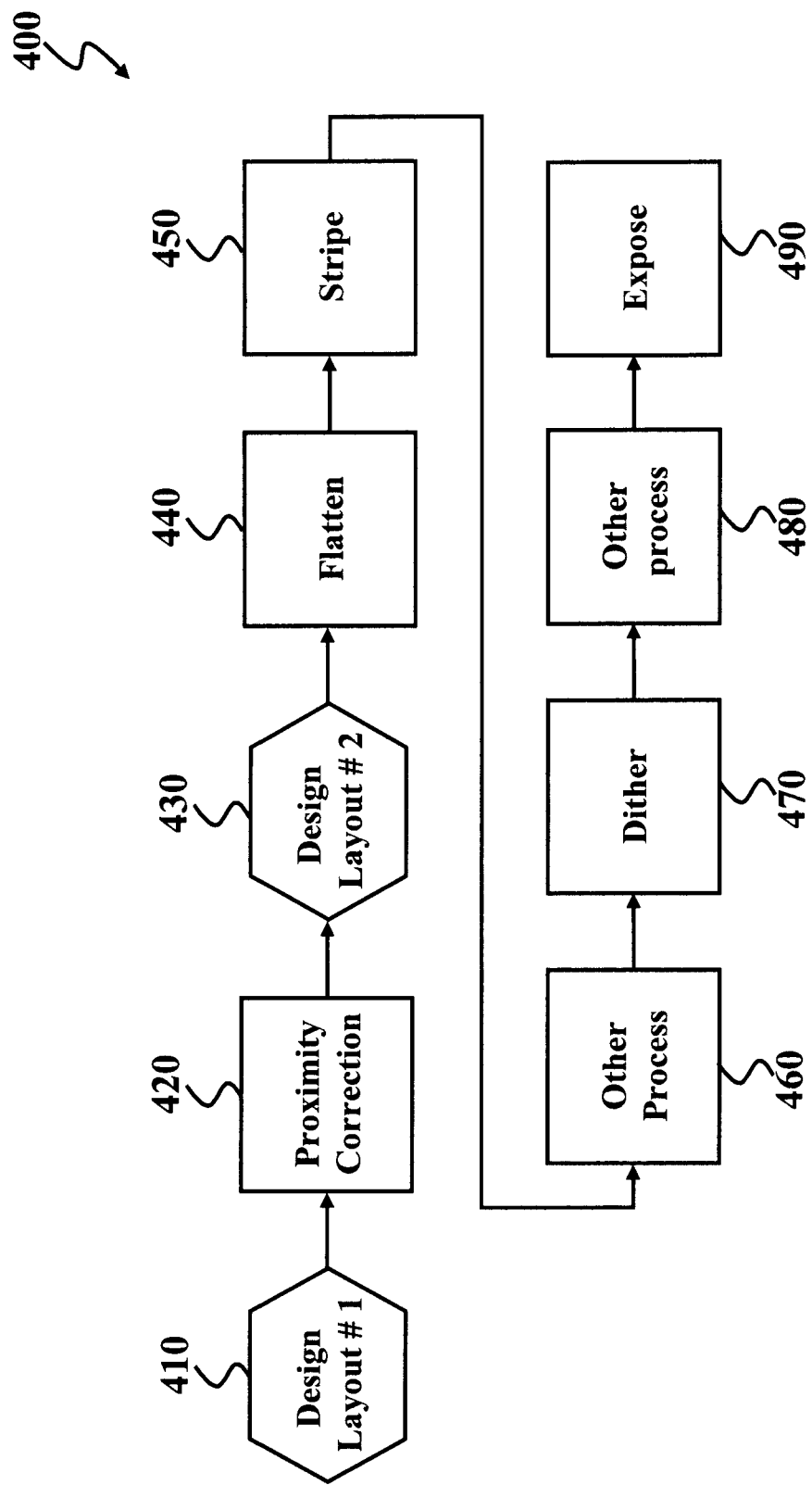

FIG. 5 is a flow chart of another method 400 that reduces data size of a design layout to be written on a recording medium according to various aspects of the present disclosure. In the depicted embodiment, the method 400 is a lithography method, specifically a charged particle beam lithography method, such as an electron beam lithography method. FIG. 5 has been simplified for the sake of clarity to better understand the inventive concepts of the present disclosure. At block 410, a design layout is provided, for example, to an electron beam apparatus. The design layout may be provided to (or received by) an electron beam data processing module of the electron beam apparatus. The design layout is similar to the design layout described above, and it has a data representation of a first size. At block 420, a proximity correction process, such as electron proximity correction (EPC), is performed on the design layout. The proximity correction process may increase the size of the data representation. At block 430, the data representation's size may be reduced to provide a smaller data representation of the design layout. For example, the design layout is divided into units and a lookup table that provides information about the units is created. The design layout's reduced data representation includes various portions of the design layout, specifically including any repeating portions once. At blocks 440 through 490, a series of processes may be performed with the design layout's reduced data representation. For example, at block 440, a flattening process may be performed on the reduced data representation; at block 450, a striping process may be performed on the reduced data representation; at block 470, a dithering process may be performed on the reduced data representation; and at block 490, the reduced data representation, along with the lookup table, may be used to expose a wafer, thereby forming the design layout on the wafer. At blocks 460 and 480, various other processes may be implemented to the reduced data representation. Additional steps can be provided before, during, and after the method 400, and some of the steps described can be replaced or eliminated for other embodiments of the method.

Figure 1:
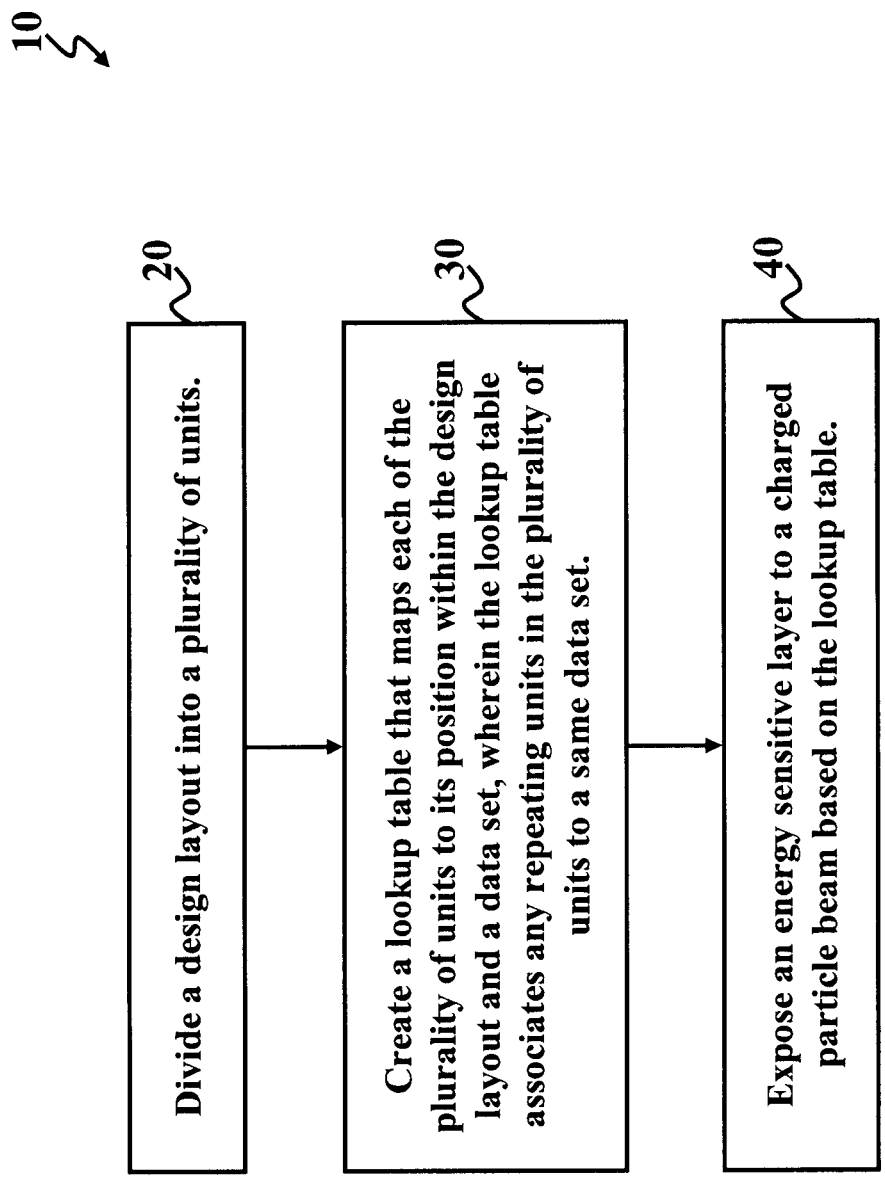
Figure 6:
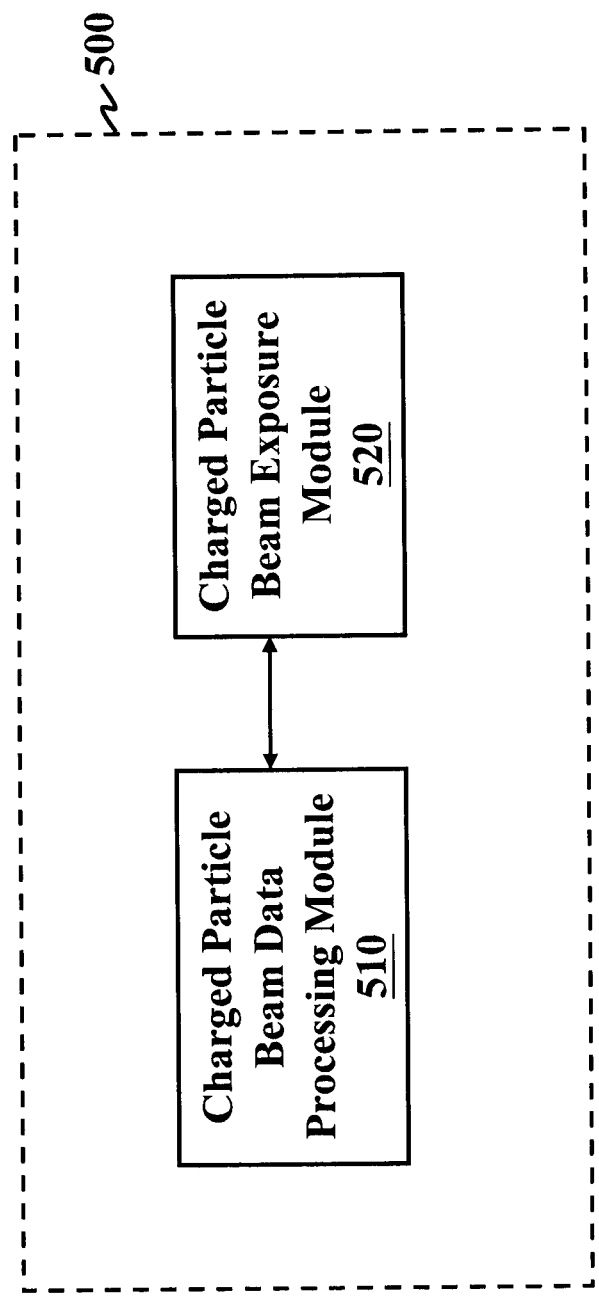

FIG. 6 is a simplified block diagram of a lithography apparatus 500 according to various aspects of the present disclosure. In the depicted embodiment, the lithography apparatus 500 is a charged particle beam lithography apparatus, such as an electron beam lithography apparatus. The lithography apparatus 500 can implement the method 10 of FIG. 1 and/or the method 400 of FIG. 5 to write a pattern, such as an integrated circuit pattern, on a wafer. The wafer is a semiconductor substrate, a mask blank, a glass substrate, a flat panel substrate, or other suitable substrate. The wafer may include a recording medium, such as an energy sensitive resist (or material) layer, formed thereon. FIG. 6 has been simplified for the sake of clarity to better understand the inventive concepts of the present disclosure. Additional features can be added in the lithography apparatus 500, and some of the features described below can be replaced or eliminated for additional embodiments of the lithography apparatus 500.

In the depicted embodiment, the lithography apparatus 500 includes a charged particle beam data processing module 510, such as an electron beam data processing module, and a charged particle beam exposure module 520, such as an electron beam exposure module. The charged particle beam data processing module 510 and the charged particle beam exposure module 520 are in communication with one another. The charged particle beam data processing module 510 is configured to read patterning data from a data storage medium, which may be within the charged particle beam data processing module 510, or remotely positioned and in communication with the charged particle beam data processing module 510. The charged particle beam data processing module 510 obtains or receives the patterning data and can load it into a memory associated with the charged particle beam data processing module 510. In the depicted embodiment, the patterning data includes a design layout, such as an IC design layout as described above. The charged particle beam data processing module 510 includes a pattern generator that processes the patterning data and generates a pattern writing instruction set, for example, a pattern writing set associated with the pattern layout. The charged particle beam data processing module 510 is also configured to reduce a size of the patterning data associated with the pattern layout, for example, by using the method 10 of FIG. 1 and/or the method 100 of FIG. 2. For example, the pattern writing instruction set will include one data set for repeating patterns in the pattern layout, instead of the patterning writing instruction set including a data set for every single pattern in the pattern layout. A lookup table will also be associated with the pattern writing instruction set, which maps each data set to its appropriate location within the pattern layout. The pattern writing instruction set may be stored in a memory associated with the charged particle beam data processing module 510. Additionally, the electron beam data processing module 510 may perform proximity correction and transformation, flattening, dithering, other suitable processes, or combinations thereof to the pattern writing instruction for the electron beam exposure module 520. Alternatively, such processes may optionally be performed separately by a standalone module. The charged particle beam data processing module 510 sends (or transfers) the pattern writing instruction set and/or the lookup table to the charged particle beam exposure module 520. The reduced size of the pattern writing set (achieved by using the method 10 of FIG. 1 and/or the method 400 of FIG. 5) can reduce data storage size, data transfer band width, and/or data transfer time. This can be particularly advantageous in high volume manufacturing situations. In an example, the charged particle beam data processing module 510 sends the pattern writing instructions, and the charged particle beam exposure module 520 communicates with the charged particle beam data processing module 520 to write the design layout using the pattern writing instructions using the lookup table associated with the pattern writing instructions.

The charged particle beam exposure module 520 includes a source that is configured to generate at least one charged particle beam. In the depicted embodiment, since the lithography apparatus 500 is an electron beam lithography apparatus, the charged particle beam is an electron beam. Alternatively, the charged particle beam may be a photon beam or ion beam. The charged particle beam may pass through one or more lenses (not shown). In an example, the charged particle beam may pass through the one or more lenses and may be focused to a beam aperture portion configured with a plurality of apertures or openings that split the charged particle beam into a plurality of beams. The number of beams may vary depending on design requirements of the lithography apparatus. The charged particle beam may be a Gaussian beam or a plurality of Gaussian beam. The charged particle beam may travel to a beam controller that is configured to allow one or more of the beams to pass through to an imaging head, or to block/blank one or more of the beams from passing through to the imaging head. The imaging head may include an electron optical system for focusing the beams that are allowed to pass through. The beam controller may include a plurality of deflectors (also referred to as blankers) that are controlled by electrical control signals that are associated with the writing instructions sent from the charged particle beam data processing module 510.

The charged particle beam exposure module 520 may further include a controller that receives the writing instructions from the charged particle beam data processing module 510. The writing instructions may be sent using light radiation as carriers of the information. The lithography apparatus 500 further includes a stage (not shown) that is configured to move in various directions. The stage may hold and secure a wafer by a vacuum system or other suitable securing mechanism. During processing, the wafer is moved or scanned relative to the imaging head and in cooperation with the controller. The charged particle beam is focused, by the lithography apparatus 500, onto the recording medium such that the pattern layout is written directly into the recording medium, without a photomask or reticle. In the depicted embodiment, as described above, the charged particle beam exposure module uses a reduced data representation of a design layout and a lookup table to write the pattern layout on the recording medium. After the entire wafer has been scanned, the recording medium may be developed to form the pattern over the wafer, and other processing, such as etching and doping, may be performed using the patterned recording medium. The lithography apparatus 500 may include other components such as an alignment system and collimator, but is simplified for a better understanding of the disclosed embodiments herein.

The present disclosure is designed to work on any architecture. For example, the charged particle beam system and method described herein may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

The present disclosure provides for many different embodiments. In an example, a method includes receiving a design layout having a data representation of a first data size, wherein the design layout includes a plurality of pattern portions; reducing the data representation from the first data size to a second data size, the second data size being less than the first data size; and using the data representation of the second data size and the lookup table to write the design layout on an energy sensitive layer. Reducing the data representation from the first data size to the second data size includes including the plurality of pattern portions in the data representation of the second size, wherein any pattern portion that is repeated in the design layout is included once in the data representation of the second data size; and creating a lookup table that maps each of the included plurality of pattern portions to at least one location within the design layout. Using the data representation of the second data size and the lookup table to write the design layout on the energy sensitive layer may include using the lookup table to write the included plurality of pattern portions in appropriate locations on the energy sensitive layer. Using the data representation of the second data size and the lookup table to write the design layout on the energy sensitive layer may include exposing the energy sensitive layer to a charged particle beam, such as an electron bean, which may include multiple electron beams. The method may further include transferring the data representation of the second data size from an electron beam data processing module to an electron beam exposure module, wherein the electron beam exposure module writes the design layout on the energy sensitive layer using the data representation of the second data size and the lookup table. The method may further include performing a proximity correction process on the data representation of the first data size, and/or dithering the data representation of the second data size. The method may further include storing the data representation of the second data size in a memory.

In another example, a method includes dividing a design layout into a plurality of units; creating a lookup table that maps each of the plurality of units to its position within the design layout and a data set, wherein the lookup table associates any repeating units in the plurality of units to a same data set; and exposing an energy sensitive layer to a charged particle beam based on the lookup table. Exposing the energy sensitive layer to the charged particle beam based on the lookup table may include using the lookup table to write the design layout on the energy sensitive layer. The method may further include, before exposing the energy sensitive layer, transferring the lookup table and a data representation of the design layout having a reduced data size from a charged particle beam data processing module to a charged particle beam exposure module.

Dividing the design layout into a plurality of units may include partitioning an integrated circuit design layout by die, cell, function, device, or pattern. Dividing the design layout into a plurality of units may include dividing a frame of a design layout into a plurality of stripes and segments, such that the frame includes a plurality of stripe-segments, each stripe-segment being a unit and including an associated pattern portion of the design layout. The number of stripes may be equivalent to a number of beams of the charged particle beam. The method may further include storing the pattern portions associated with each stripe-segment in a memory, wherein any repeating pattern portions are stored once. Creating the lookup table that maps each of the plurality of units to its position within the design layout and a data set may include mapping each of the stored pattern portions with its associated stripe-segment, wherein the any repeating pattern portions are mapped to more than one associated stripe-segment. The method may further include dithering the stored pattern portions.

In yet another example, an electron beam apparatus includes an electron beam exposure module and an electron beam data processing module in communication with the electron beam exposure module. The electron beam data processing module is programmed to receive a design layout having a data representation of a first data size, wherein the design layout includes a plurality of pattern portions and reduce the data representation from the first data size to a second data size, the second data size being less than the first data size. Reducing the data size of the data representation includes including the plurality of pattern portions in the data representation of the second data size, wherein any pattern portion that is repeated in the design layout is included once in the data representation of the second data size; and creating a lookup table that maps each of the included plurality of pattern portions to at least one location within the design layout. The electron beam exposure module may be programmed to write the design layout on an energy sensitive layer using the data representation of the second data size and the lookup table. The electron beam data processing module may be programmed to transfer the lookup table and the data representation of the second data size to the electron beam exposure module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
dividing a design layout into a plurality of units;
creating a lookup table that maps each of the plurality of units to its position within the design layout and a data set, wherein the lookup table associates any repeating units in the plurality of units to a same data set; and
exposing an energy sensitive layer to a charged particle beam based on the lookup table.

2. The method of claim 1 wherein the dividing the design layout into a plurality of units includes partitioning an integrated circuit design layout by die, cell, function, device, or pattern.

3. The method of claim 1 wherein the dividing the design layout into a plurality of units includes dividing a frame of a design layout into a plurality of stripes and segments, such that the frame includes a plurality of stripe-segments, each stripe-segment being a unit and including an associated pattern portion of the design layout.

4. The method of claim 3 wherein the dividing the frame of the design layout into the plurality of stripes includes dividing the frame into a number of stripes that is equivalent to a number of beams of the charged particle beam.

5. The method of claim 3 further including storing the pattern portions associated with each stripe-segment in a memory, wherein any repeating pattern portions are stored once.

6. The method of claim 5 wherein the creating the lookup table that maps each of the plurality of units to its position within the design layout and a data set includes mapping each of the stored pattern portions with its associated stripe-segment, wherein the any repeating pattern portions are mapped to more than one associated stripe-segment.

7. The method of claim 5 further including dithering the stored pattern portions.

8. The method of claim 1 wherein the exposing the energy sensitive layer to the charged particle beam based on the lookup table includes using the lookup table to write the design layout on the energy sensitive layer.

9. The method of claim 1 further including, before exposing the energy sensitive layer, transferring the lookup table and a data representation of the design layout having a reduced data size from a charged particle beam data processing module to a charged particle beam exposure module.

10. A method comprising:
reducing a design layout having a data representation of a first data size, wherein the design layout includes a plurality of pattern portions, to a second data size, the second data size being less than the first data size, wherein any pattern portion that is repeated in the design layout is included once in the data representation of the second data size;
creating a lookup table that maps each of the included plurality of pattern portions to at least one location within the design layout; and
exposing an energy sensitive layer to a charged particle beam based on the lookup table.

11. The method of claim 10, further including transferring the data representation of the second data size from an electron beam data processing module to an electron beam exposure module, wherein the electron beam exposure module writes the design layout on the energy sensitive layer using the data representation of the second data size and the lookup table.

12. The method of claim 10 further including performing a proximity correction process on the data representation of the first data size.

13. The method of claim 10 further including dithering the data representation of the second data size.

14. The method of claim 10 further including storing the data representation of the second data size in a memory.

15. The method of claim 10 wherein the using the data representation of the second data size and the lookup table to write the design layout on the energy sensitive layer includes using the lookup table to write the included plurality of pattern portions in appropriate locations on the energy sensitive layer.

16. The method of claim 10 wherein the exposing the energy sensitive layer to the charged particle beam includes exposing the energy sensitive layer to multiple electron beams.

* * * * *